(12) United States Patent
Okutani et al.

(10) Patent No.: US 6,235,109 B1
(45) Date of Patent: May 22, 2001

(54) METHOD OF PREPARING CRYSTALLINE OR AMORPHOSE MATERIAL FROM MELT

(75) Inventors: Takeshi Okutani; Hideaki Nagai; Hideki Minagawa; Yoshinori Nakata; Takashi Tsurue; Masaki Orihashi, all c/o Hokkaido National Industrial Research Institute of 2-1, Tukisamuhigashi 2-jo 17-chome Toyohira-ku, Sapporo-shi, Hokkaido (JP)

(73) Assignees: Takeshi Okutani; Hideaki Nagai; Hideki Minagawa; Yoshinori Nakata; Takashi Tsurue; Masaki Orihashi; Secretary of Agency of Industrial Science and Technology, all of (JP)

( * ) Notice: Subject to any disclaimer, the term of this patent is extended or adjusted under 35 U.S.C. 154(b) by 0 days.

(21) Appl. No.: 09/669,615

(22) Filed: Sep. 26, 2000

(30) Foreign Application Priority Data

Sep. 28, 1999 (JP) .................................. 11-273814

(51) Int. Cl.[7] ..................................... C30B 11/00
(52) U.S. Cl. .............................. 117/12; 117/901; 117/914
(58) Field of Search .............................. 117/901, 12, 914, 117/11

(56) References Cited

U.S. PATENT DOCUMENTS

| | | | |
|---|---|---|---|
| 4,198,232 | * 4/1980 | Parr et al. | 75/135 |
| 4,321,086 | * 3/1982 | Perepezko et al. | 75/5 C |
| 4,378,209 | * 3/1983 | Berge et al. | 432/58 |
| 4,389,904 | * 6/1983 | Lacy et al. | 73/863.11 |
| 4,553,917 | * 11/1985 | Lee | 425/6 |
| 4,758,267 | * 7/1988 | Webb | 75/5 B |
| 5,279,787 | * 1/1994 | Oltrogge | 419/38 |
| 5,319,670 | * 6/1994 | Fox | 373/138 |
| 5,340,239 | * 8/1994 | van den | 405/224 |
| 6,153,007 | * 11/2000 | Nakata | 117/11 |

FOREIGN PATENT DOCUMENTS

08247905 * 9/1996 (JP) .............................. C30B/35/00

* cited by examiner

*Primary Examiner*—Robert Kunemund
*Assistant Examiner*—Matthew Anderson
(74) *Attorney, Agent, or Firm*—Lorusso & Loud

(57) ABSTRACT

A method of preparing a crystalline or amorphous material, wherein a droplet of a melt of a metal-containing material is cooled in the atmosphere of an inert gas or in vacuum and in a microgravity environment to solidify the droplet. The cooling is performed by impingement of the droplet prior to solidification against a cooling surface.

6 Claims, No Drawings

METHOD OF PREPARING CRYSTALLINE OR AMORPHOSE MATERIAL FROM MELT

BACKGROUND OF THE INVENTION

This invention relates to a method of preparing a high quality crystalline or amorphous material by solidification of a melt of a metal-containing material.

A method is known in which a melt of a metal-containing material such as a semiconductor is quenched to form an amorphous film. A roller, a plate or a rotatable drum is generally used for quenching at a rate of $10^4$ to $10^{8°}$ C. per second. The amorphous film is heat treated for crystallization. The crystalline film thus obtained, however, is not uniform in composition and texture.

SUMMARY OF THE INVENTION

It is, therefore, an object of the present invention to provide a simple method which can prepare a high quality crystalline or amorphous material by solidification of a melt of a metal-containing material.

In accordance with the present invention there is provided a method of preparing a crystalline or amorphous material, comprising the steps of:

(a) forming a droplet of a melt of a metal-containing material; and (b) cooling the droplet in the atmosphere of an inert gas or in vacuum and in a microgravity environment to solidify the droplet, wherein the cooling is performed by impingement of the droplet against a cooling surface prior to solidification.

The above method can be carried out in a space shuttle in orbit.

Alternatively, the above step (b) may be carried out by combination of the following sub-steps (b1) and (b2):

(b1) the droplet is permitted to free fall with an initial velocity of substantially zero, and (b2) then, before the droplet is solidified, the droplet is allowed to impinge on the cooling surface to solidify the droplet.

The above free fall may be performed using a falling capsule. Thus, in step (a) the droplet is formed in a closed capsule in which the cooling surface is fixedly secured. In sub-step (b1), the capsule is allowed to free fall with an initial velocity of substantially zero. In step (b2), the capsule is stopped falling so that the droplet impinges on the cooling surface.

Other objects, features and advantages of the present invention will become apparent from the detailed description of the invention to follow.

DETAILED DESCRIPTION OF THE PREFERRED EMBODIMENTS OF THE INVENTION

For the preparation of a crystalline or amorphous material, any substance capable of forming a crystalline or amorphous material from a melt may be used as a raw material. Thus, metallic elements, metal compounds, metalloids, alloys, semiconductors and ceramics may be used for the purpose of the present invention. Illustrative of suitable raw material substances are Ti, Fe, Si, Ge, a Ti—Ni alloy, a Cu—Al alloy, a Cu—In alloy, indium antimonide (In—Sb), Fe—Si, Cu—In—Se and metal garnet composite materials such as yttrium aluminum garnet. The raw material may be in the form of a powder, a lump or a film. The raw material generally has a melting point of at least 100° C., preferably at least 500° C. The upper limit of the melting point is not specifically restricted but is generally about 2500° C.

The metal-containing material is placed in vessel such as a crucible and heated using any suitable heater, such as an electric furnace, an infrared heater, an electronic oven or an electromagnetic levitation heater, to form a melt. The melt is formed in a suitable atmosphere determined according to the kind of the metal-containing material. For example, a non-oxidizing atmosphere is adopted when the-metal-containing material is susceptible to oxidation. When the metal-containing material is an oxide, an oxidizing atmosphere may be used. Thus, the melt may be prepared in an inert atmosphere such as in the atmosphere of argon or helium; under vacuum of 2660 Pa or less, preferably 133 Pa or less; or in an active atmosphere such as in the atmosphere of hydrogen or oxygen. When the metal-containing material contains a substance having a high vapor pressure, a pressurized condition may be adopted for the formation of a melt thereof.

The melt is then formed into a droplet or droplets. By providing a small diameter hole or orifice in a bottom of a container containing the melt, the melt flows out of the container through the hole and forms a droplet attached to the hole. The droplet is then released from the hole and is allowed to free fall or to be suspended. For the purpose of facilitating the formation of the droplet, a pressure, such as a gas pressure, may be applied to the melt. Alternatively, the vessel may be vibrated. However, it is important that the droplet should have an initial velocity of substantially zero.

The diameter of the droplet is determined according to the size of the hole, the viscosity of the melt, the wettability of the melt relative to the surface of the vessel and the specific gravity of the melt. Generally, the droplet has a diameter in the range of 0.1–50 mm, preferably 2–10 mm.

The droplet of the melt is cooled in the atmosphere of an inert gas or in vacuum and in a microgravity environment to solidify the droplet, wherein the cooling is performed by impingement of the droplet prior to solidification against a cooling surface.

In a first embodiment, the above solidification may be carried out by allowing the droplet to free fall. The atmosphere in which the droplet falls may be the same as that used for the formation of the melt but, preferably, vacuum of 2660 Pa or less, more preferably 133 Pa or less, is used. The free falling droplet then impinges upon a cooling surface so that the solidification starts at a point or area in which the droplet of the melt is brought into contact with the cooling surface.

The distance between the hole from which the droplet is released and the cooling surface should be such that the droplet can undergo free fall. Thus, the distance of the free fall will normally be from greater than 0 to about 50000 times the diameter of the droplet. It is important that the solidification of the droplet of the melt should start after the droplet has been brought into contact with the cooling surface. Therefore, an excessively long distance of the free fall should be avoided. The distance of the free fall may be determined in view of the melting point of the metal-containing material from which the melt is prepared, the temperature of the droplet of the melt, the degree of supercooling of the droplet caused during the free fall and the radiation of heat from the surface of the droplet during the free fall. The optimum free fall distance will be determined by preparatory experiments.

The cooling surface against which the droplet of the melt impinges may be flat or curved and may be made of any suitable material such as a metal (e.g. copper, iron or an alloy) or ceramic (e.g. glass or aluminum nitride) which does not melt upon contact with the droplet. The cooling surface is generally maintained at a temperature lower by at least 100° C., preferably by 500–2500° C., than the melting point of the droplet.

The droplet of the melt begins solidifying upon contact with the cooling surface to form a crystalline material. The shape of the crystalline material depends upon the shape of the cooling surface. When the cooling surface is flat and is disposed horizontally, the crystalline product will be in the form of a thin film whose area and thickness depend upon the temperature, viscosity and falling velocity of the droplet at the time of the impingement as well as the temperature of the cooling surface.

Since the droplet is maintained as if it were in a microgravity environment during the free fall, convection of heat does not occur in the droplet. Thus, the droplet is homogeneous and the solidified material is homogeneous, too. The solidification of the droplet starts at a point thereof which is first brought into contact with the cooling surface. The solidification proceeds radially outward from the contact point as the contact area propagates. Therefore, the solidification proceeds without causing a stress in the solidifying material, so that the resulting crystalline material has no defects.

In another embodiment according to the present invention, the droplet is formed in a closed capsule in which the above-described cooling surface is fixedly secured. The capsule is allowed to free fall with an initial velocity of substantially zero, so that the droplet as well as the cooling surface are maintained in a microgravity environment. The capsule is captured and stopped falling so that the droplet impinges on the cooling surface. The atmosphere within the capsule may be maintained in a pressurized condition, if desired.

In a further embodiment according to the present invention, the droplet is formed and suspended in a space shuttle in orbit. The droplet is then collided against a cooling surface such as a rotating blade and is solidified.

The following example will further illustrate the present invention.

EXAMPLE 1

A quartz glass pipe having a length of 1 m and a diameter of 30 mm was fixed coaxially within a stainless steel pipe, having a length of 13 m and a diameter of 30 cm, at an upper portion thereof. An electric heater was provided around the outer periphery of the quartz glass pipe. A quartz glass feeder tube having a length of 30 cm and an inside diameter of 8 mm was fitted in the quartz glass pipe at an upper portion thereof. The feeder tube had a lower end portion whose diameter decreased so that the lower tip end thereof had an orifice diameter of 0.3 mm.

A mixed powder (0.3 g) composed of Cu and In and having a Cu/In atomic ratio of 0.66:0.34 was charged in the feeder tube. The inside space of the stainless steel pipe was replaced by a helium gas and then evacuated to have a He atmosphere of 133 Pa. The Cu-In mixed powder in the feeder tube was heated to 750° C. with the heater and the resulting melt was maintained at that temperature. From the top of the feeder pipe, a pressure of a helium gas at 5333 Pa was applied to the melt, so that the melt was extruded through the orifice to form a droplet of the melt depending from the orifice. The droplet had grown to have a diameter of about 2 mm when it left the orifice. The droplet free fell in the stainless steel pipe with an initial velocity of substantially zero. The droplet of the melt during the free fall was found to be substantially spherical, indicating that the surface tension of the melt acted uniformly because the droplet was maintained in a microgravity environment.

The droplet impinged upon a square quartz glass plate having a thickness of 1 mm and a side length of 10 cm and disposed in the stainless steel pipe at a position 6.5 m below the orifice of the feeder pipe. The plate had a temperature of 20° C. The droplet solidified upon the impingement.

The solidified product was subjected to microscopic analysis, analysis using X-ray microanalyser and powder X-ray diffraction analysis. Thus, the product was cut, polished and etched for 20 seconds with an etching solution obtained by dissolving 2 g of ferric chloride in 20 ml concentrated hydrochloric acid. The etched surface was observed by an optical microscope. Neither grain boundaries nor defects were observed. The analysis using X-ray microanalyser revealed that the distribution of Cu and In was uniform, indicating that the product had uniform composition. The powder X-ray diffraction pattern of the product showed that $Cu_2In$ was the only crystal contained in the product.

Comparative Example

Example 1 was repeated in the same manner as described except that the impingement of the droplet of the melt upon the plate was not carried out. Rather, the droplet was collected in a silicone oil contained in a vessel placed on the bottom of the stainless steel pipe. Thus, the droplet had solidified during its free fall through 13 m before it was collected in the silicone oil. The solidified product was analyzed in the same manner as in Example 1. The microscopic analysis revealed crystal grains of a diameter of about 25 μm distributed throughout the etched surface. The analysis using X-ray microanalyser revealed that the distribution of Cu and In was not uniform. The powder X-ray diffraction pattern of the product showed that $Cu_2In$ was the only crystal contained in the product.

The invention may be embodied in other specific forms without departing from the spirit or essential characteristics thereof. The present embodiments are therefore to be considered in all respects as illustrative and not restrictive, the scope-of the invention being indicated by the appended claims rather than by the foregoing description, and all the changes which come within the meaning and range of equivalency of the claims are therefore intended to be embraced therein.

What is claimed is:

1. A method of preparing a crystalline or amorphous material, comprising the steps of:

(a) forming a droplet of a melt of a metal-containing material; and (b) cooling said droplet in the atmosphere of an inert gas or in vacuum and in a microgravity environment to solidify said droplet, wherein said cooling is performed by impingement of said droplet prior to solidification against a cooling surface.

2. A method as claimed in claim 1, wherein step (b) includes the sub-steps of:

(b1) permitting said droplet to free fall with an initial velocity of substantially zero; and (b2) then, before said droplet is solidified, allowing said droplet to impinge on said cooling surface to solidify said droplet.

3. A method as claimed in claim 2, wherein, in step (a) said droplet is formed in a closed capsule in which said cooling surface is fixedly secured, wherein, in sub-step (b1), said capsule is allowed to free fall with an initial velocity of substantially zero, and wherein, in step (b2), said capsule is stopped falling so that said droplet impinges on said cooling surface.

4. A method as claimed in claim 1, wherein said crystalline material is selected from the group consisting of metallic elements, metalloids, alloys, semiconductors and ceramics.

5. A method as claimed in claim 1, wherein said droplet has a particle diameter of 0.1–50 mm.

6. A method as claimed in claim 1, wherein said cooling surface is of a metal or ceramic material.

* * * * *